(12) United States Patent
Pekarich et al.

(10) Patent No.: US 6,633,615 B1
(45) Date of Patent: Oct. 14, 2003

(54) TRELLIS TRANSITION-PROBABILITY CALCULATION WITH THRESHOLD NORMALIZATION

(75) Inventors: Steven P. Pekarich, Slatington, PA (US); Xiao-An Wang, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/495,161

(22) Filed: Jan. 31, 2000

(51) Int. Cl.[7] ............................. H04L 5/12; H04L 27/28; H04L 27/06; H03M 13/00; H03M 13/03
(52) U.S. Cl. ....................... 375/265; 375/259; 375/260; 375/261; 375/262; 375/341; 714/752; 714/755; 714/760; 714/796
(58) Field of Search ............................. 375/265, 261, 375/260, 259, 341, 262; 386/116; 714/752, 760, 755, 796

(56) References Cited

U.S. PATENT DOCUMENTS

| | | | | |
|---|---|---|---|---|
| 5,307,374 A | * | 4/1994 | Baier ........................... | 375/11 |
| 5,331,665 A | * | 7/1994 | Busschaert et al. ........... | 375/94 |
| 5,398,254 A | * | 3/1995 | Miya et al. ................... | 371/43 |
| 6,263,467 B1 | * | 7/2001 | Hladik et al. ................. | 714/755 |
| 6,304,996 B1 | * | 10/2001 | Van Stralen et al. ......... | 714/796 |
| 6,445,754 B1 | * | 9/2002 | Itoi .............................. | 375/341 |
| 6,532,337 B1 | * | 3/2003 | Yoshinaka .................... | 386/116 |
| 2002/0029362 A1 | * | 3/2002 | Stephen et al. .............. | 714/752 |

* cited by examiner

*Primary Examiner*—Stephen Chin
*Assistant Examiner*—Sam K. Ahn
(74) *Attorney, Agent, or Firm*—Steve Mendelsohn; Ian M. Hughes

(57) ABSTRACT

A circuit performs threshold normalization of accumulated transition probabilities for a given state of a state transition trellis in a maximum likelihood detector. Threshold normalization may be accomplished by comparison and setting of a single bit in stored transition probabilities. Threshold value comparison may be accomplished by comparing the $b^{th}$ bit of the stored transition probabilities if the threshold value is $_2b$. When all transition probabilities exceed the threshold value at a stage of the trellis, the transition probabilities are scaled, such as by subtracting the threshold value. Scaling may be implemented by setting the compared $b^{th}$ bits to zero before storage. In general, since accumulated transition probabilities are monotonically increasing for transition probabilities of paths through the trellis in both forward and reverse directions, the present invention may be employed for both threshold normalization of both the forward ($\alpha$) and reverse ($\beta$) transition probabilities.

25 Claims, 3 Drawing Sheets

TRELLIS TRANSITION-PROBABILITY CALCULATION WITH THRESHOLD NORMALIZATION

BACKGROUND OF THE INVENTION

1. Field of the Invention

The present invention relates to decoding of a data stream in a communications system, and, more particularly, to a threshold normalization of state transition probabilities in a data detector employing a state transition trellis.

2. Description of the Related Art

Communication systems commonly employ encoding of data prior to transmission through, or recording on, a medium. Such systems commonly use convolutional or block codes to encode the data as a sequence of symbols. The transmitted or recorded signal with the encoded data is then demodulated and sampled by a receiver to produce a sequence of channel samples. The transmission or storage medium and the subsequent reception, demodulation, and sampling (including equalization of received samples by the receiver) defines a partial response channel through which the encoded data signal passes. The receiver generally includes maximum likelihood (ML) detector, e.g., either a Viterbi or a maximum aposteriori (MAP) detector, to detect and reconstruct the symbols prior to decoding of the detected, encoded data, or to decode detected and reconstructed symbols. For example, wireless communication systems operating in accordance with the CDMA 2000 standard include a MAP detector for decoding in the turbo-decoder of a receiver.

The ML detector provides a maximum a posteriori estimate of a state sequence of a finite-state, discrete-time Markov process observed in noise. Given a received sequence of channel samples of a signal corrupted with additive noise, the algorithm finds a sequence of symbol bits which is "closest" in a state trellis to the received sequence of channel samples. The trellis corresponds to possible states (portion of received symbol bits in the sequence) for each received channel symbol per unit increment in time (e.g., one clock cycle). For the algorithm used by the detector, the term "closest" is mathematically defined relative to a pre-defined metric incorporating the probabilities associated with certain state transitions as well as the cumulative probabilities associated with following each path through the trellis. For the trellis diagram, the number of bits (corresponding to output channel samples and detected symbol bits) for a state is usually equivalent to the memory of the partial response channel. Transitions are "weighted" according to the predefined metric, and Euclidean distance may be used as a metric for the trellis structure.

FIG. 1 shows an 8-state trellis employed for a partial response channel having a memory length of three. The left stage 101 of 3-bit states d(n−3), d(n−2), d(n−1) represents state symbol bits for the channel samples in the ML detector during a previous clock cycle, while the right stage 102 of 3-bit states d(n−2), d(n−1), d(n) represents state symbol bits for the channel samples during the current clock cycle. The right stage 102 includes the state symbol bit d(n) that corresponds to the currently received output channel sample at time n.

Each line, termed a branch, connecting the states in the left and right stages 101 and 102 represents a transition between states of the trellis (i.e., a state of the previous trellis phase to a state of a current trellis phase). The branch is a portion of a possible path through the trellis, and may be included in more than one path. For example, a branch connects the state #0 ("000") in the left stage 101 (the originating state) to state #0 ("000") in the right stage 102. This branch represents a potential decision of the detector that not only identifies the current channel sample d(n) as being a "0" symbol, but also for the path representing the sequence of symbol bits received by the ML detector up to time n. A branch also connects the state #4 ("100") to state #0 ("000") and represents a potential decision for channel sample d(n) being a "0" symbol except that now the originating state is "100". Therefore, two branches from the previous state may pass through the present state "000".

Similarly, two branches pass through each of the other states in the current trellis phase. Any destination state ending in a "0" represents d(n) being the "0" symbol for the path going through the state, while any destination state ending in a "1" represents d(n) equivalent to the "1" symbol for the path going through the state. In general, the different possible paths may be represented by a P-state trellis where $P=2^Q$, where is Q an integer equivalent to the state length (i.e., memory length of the partial response channel).

The algorithm of the ML detector recursively performs three steps to detect a path through a trellis corresponding to the received sequence of symbol bits in the forward direction (i.e., states from left to right in FIG. 1). First, branch metrics for the trellis are calculated for the current states; second, updates for each state metric are calculated for all states; and, third, survivor paths are determined. In addition, some algorithms perform similar steps to detect a path through a trellis corresponding to the received sequence of symbol bits in the reverse direction (i.e., states from right to left in FIG. 1). The survivor path represents the sequence of symbol bits as transitions between states in the trellis which is closest, according to the Euclidean distance, to the received sequence of symbol bits in noise.

The branch metric for a state transition is defined as the Euclidean distance between the received channel sample ($y_r[n]$) and the ideal channel output sample ($y_i[n]$) corresponding to the transition. The path metric is simply the accumulated branch metrics of different branches encountered by the path through phases of the trellis as different possible paths are considered. The state metric of a given state is the path metric at some particular time if the path includes the given state at that particular time. To compute the entire, or global, sequence most likely received, the algorithm recursively calculates and updates state metrics of all states to provide a minimum path metric over several state transitions. The maximum likelihood sequence of the trellis is found by determining the sequence of symbol bits, or path, through the trellis that provides a minimum path metric in either the forward, reverse, or forward and reverse directions.

For a turbo decoder operating in accordance with a CDMA 2000 standard, the turbo decoder processor (TDP) calculates branch metrics from extrinsic in formation, systematic data, and parity, an then calculates the forward (α) transition probabilities in the forward direction of the trellis and reverse (β) transition probabilities in the reverse direction of the trellis. Transition probabilities are quantities that are either substantially equal or directly related to branch and state metric values. In addition, as the path metrics are updated, the forward or reverse transition probabilites are accumulated. Since processors have storage with finite resolution (i.e., they have M bits available to store path metric values), a technique known as threshold normalization is employed to prevent data overflow. Prior art ML detectors employ a magnitude compare and subtract operation for threshold normalization. The accumulated transition probability ($\alpha$ or $\beta$) of a state is compared with a threshold value. If the accumulated transition probability for each state in the stage of the trellis is greater than the threshold value, the threshold value is subtracted from the accumulated transition probability. Threshold normalization may be employed several times in a trellis, but tracking when each normalization operation takes place is not necessary. Such threshold normalization, however, requires a magnitude compare circuit and a subtraction circuit which increase the complexity and integrated circuit area of the TDP implementing an ML detector.

SUMMARY OF THE INVENTION

In accordance with exemplary embodiments of the present invention, a threshold value for threshold normalization and scaling of stages in a trellis of a maximum likelihood (ML) detector is selected so that a single bit, the $b^{th}$ bit, of the stored transition probability (or state and branch metric) may be employed to determine whether the threshold value has been met or crossed ("threshold detection"). When the threshold detection occurs for all transition probabilities (or state and branch metrics) in a given stage, scaling occurs by setting the corresponding $b^{th}$ bit to 0, thereby subtracting the threshold value from the transition probability.

In accordance with an embodiment of the present invention, threshold normalization is applied to a plurality of transition probabilities of a state transition trellis where each transition probability is stored as a binary value of M bits. A test determines whether a $b^{th}$ bit of each of the plurality of transition probabilities is set, wherein, if each of the $b^{th}$ bits is set, the plurality of transition probabilities of the stage has met a threshold value less than M and related to $2^b$. Each of the plurality of transition probabilities are scaled if each of the $b^{th}$ bits is set. In a further embodiment, scaling is accomplished by resetting each $b^{th}$ bit to scale the plurality of transition probabilities, wherein, for some cases, resetting each $b^{th}$ bit subtracts the threshold value from each of the plurality of transition probabilities.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with exemplary embodiments of the present invention, threshold normalization of accumulated transition probabilities for a given state of a ML detector trellis may be accomplished by comparison of a single bit of the transition probability, and then scaling (e.g., subtracting the threshold). Scaling may be implemented by setting the compared bit to zero. In general, since accumulated transition probabilities are monotonically increasing for paths through the trellis in both forward and reverse directions of the trellis, the present invention may be employed for both threshold normalization during calculation of both the forward ($\alpha$) and reverse ($\beta$) transition probabilities of a stage. For the following, the transition probability values each are stored as binary values in registers with a finite resolution of M bits (i.e., M bits are available to store branch/state metric or transition probability values).

Figure 1:
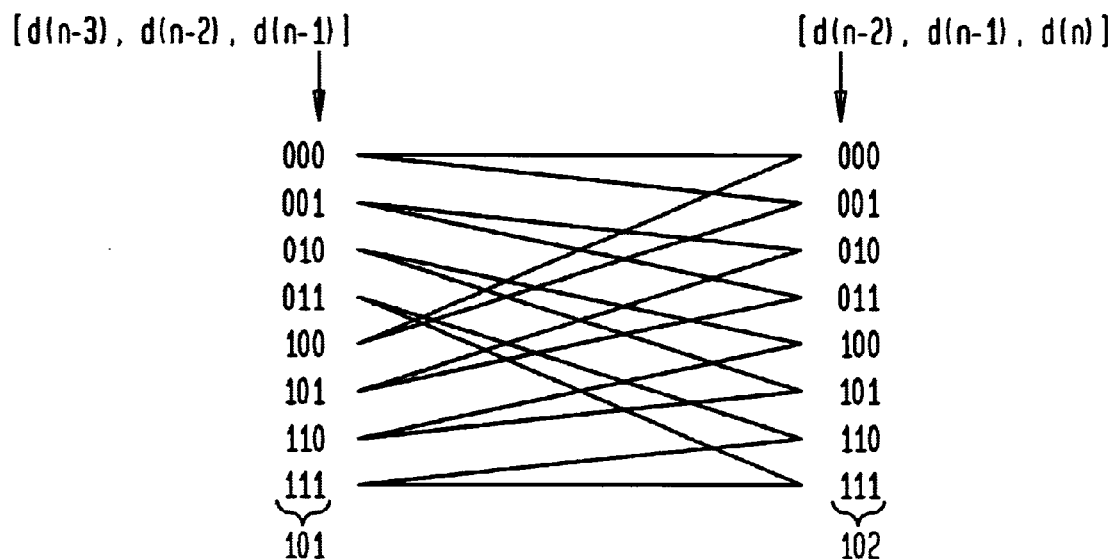
FIG. 1 shows a trellis of a maximum likelihood detector of the prior art having an eight-state transition diagram.
Figure 2:
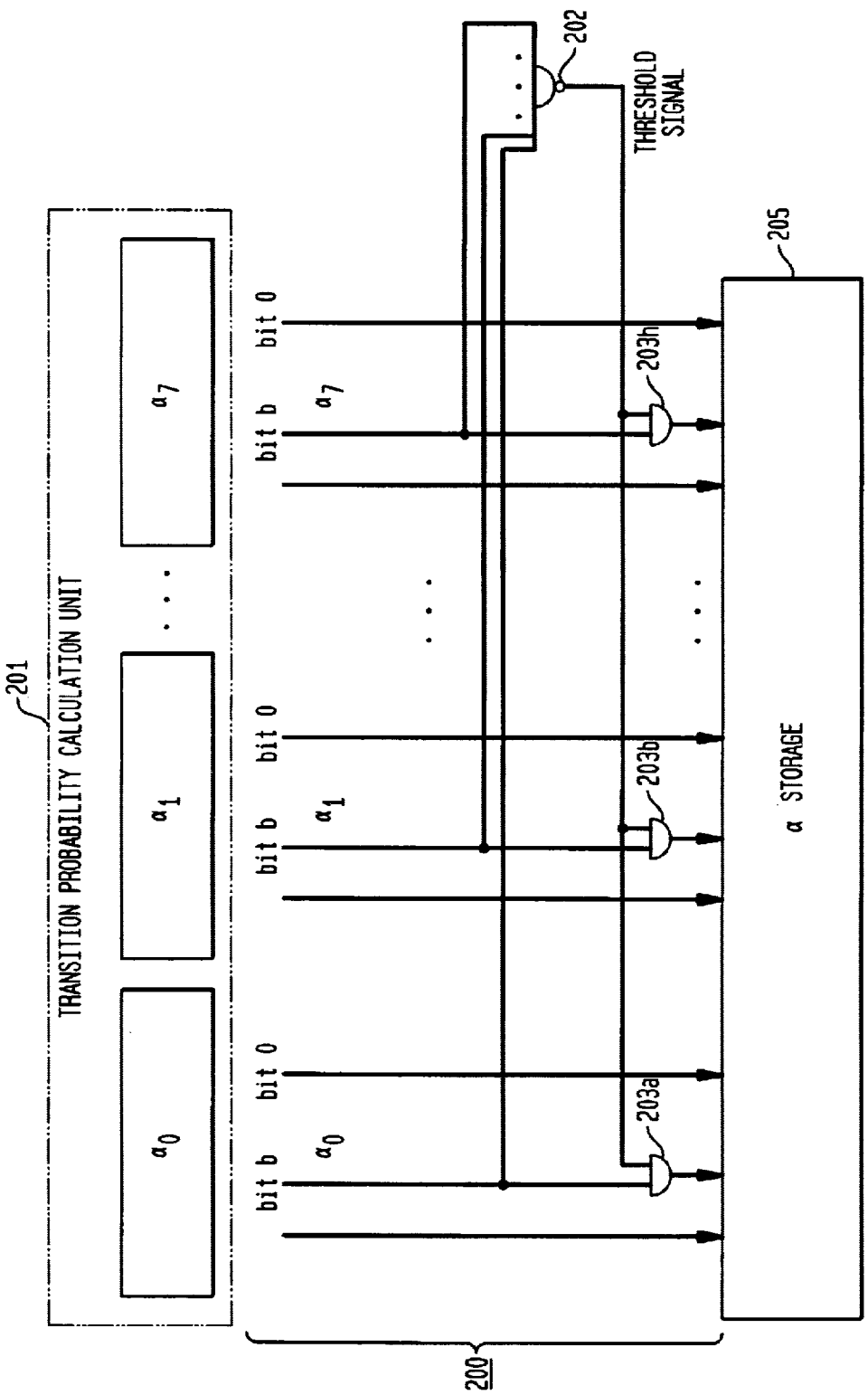
FIG. 2 shows a circuit for threshold normalization detection and scaling in accordance with an exemplary embodiment of the present invention.

FIG. 2 shows a circuit 200 for threshold normalization detection and scaling in accordance with an exemplary embodiment of the present invention. Threshold normalization detection and scaling circuit 200 includes NAND gate 202 and AND gates 203a–203h. The exemplary implementation of circuit 200 shown in FIG. 2 performs threshold detection and scaling for eight forward transition probability values ($\alpha_0$ through $\alpha_7$) of a state transition trellis having eight states (i.e., three channel sample values), such as the trellis shown in FIG. 1. As would be apparent to one skilled in the art, however, the techniques described herein may be extended to threshold detection and scaling for reverse ($\beta$) transition probability values, or other representations of state and branch metrics, for any number of states and for any corresponding state transition trellis.

Threshold normalization detection and scaling circuit 200 receives forward transition probability (FTP) values $\alpha_0$ through $\alpha_7$ as M-bit values from transition probability calculation (TPC) unit 201. TPC unit 201 calculates updated transition probabilities for states in a stage of the trellis in a manner well known in the art. Each of the FTP values $\alpha_0$ through $\alpha_7$ is compared with a threshold value. The threshold value is a power of 2, so the threshold value is set as $2^b$ where b is a positive integer and $0 \leq b \leq M$. To determine if the FTP value has exceeded the threshold value of $2^b$, the present invention performs threshold detection by testing whether the $b^{th}$ bit of FTP value has been set to one by the TPC unit 201. As would be apparent to one skilled in the art, some implementations may invert binary or logic values, so setting a bit may be defined alternatively by setting the bit value to zero.

Scaling (subtraction of the threshold value) is performed when all the FTP values $\alpha_0$ through $\alpha_7$ are equivalent to or exceed the threshold value. The value for b is generally selected such that the threshold value $2^b$ is reasonably large so that each of the FTP values $\alpha_0$ through $\alpha_7$ will exceed the threshold at the same stage without the $(b+1)^{st}$ bit of any FTP values $\alpha_0$ through $\alpha_7$ being set to 1. As is known, by setting the initial transition probability (for forward transition probabilities) and end transition probability (for reverse transition probabilities) to predetermined values, the transition probabilities calculated by the TPC unit 201 at a current stage of the trellis are greater than the transition probabilities calculated at the previous stage of the trellis and the accumulated transition probabilities for each stage remain bounded.

Threshold detection is accomplished using NAND gate 202. The $b^{th}$ bit of each of the FTP values $\alpha_0$ through $\alpha_7$ is applied to the input of NAND gate 202. Unless all input logic values to NAND gate 202 are logic "1", the output of NAND gate 202 is logic "1". When the $b^{th}$ bit of each of the FTP values $\alpha_0$ through $\alpha_7$ is logic "1", all input logic values to NAND gate 202 are logic "1" and the output of NAND gate 202 is logic "0", indicating that all FTP values $\alpha_0$ through $\alpha_7$ have exceeded the threshold value.

Scaling is accomplished using AND gates 203a–203h. AND gates 203a–203h each receive the $b^{th}$ bit of the corresponding one of FTP values $\alpha_0$ through $\alpha_7$ as well as the output of NAND gate 202. When the output of NAND gate 202 is logic "1", the output of each AND gate 203a–203h is the $b^{th}$ bit of the corresponding one of FTP values $\alpha_0$ through $\alpha_7$. When the output of NAND gate 202 is logic "0", the output of each AND gate 203a–203h is logic "0", thereby setting the $b^{th}$ bit of the corresponding one of FTP values $\alpha_0$ through $\alpha_7$ to "0". Setting the $b^{th}$ bit of the FTP values $\alpha_0$ through $\alpha_7$ to "0" subtracts the threshold value $2^b$ from each of the FTP values $\alpha_0$ through $\alpha_7$, which FTP values are then stored in forward transition probability storage registers 205.

As shown in FIG. 2, the most significant bits (MSBs) greater than the $b^{th}$ bit are not altered, since each of the FTP values $\alpha_0$ through $\alpha_7$ may exceed the threshold at the same stage without the $(b+1)^{st}$ bit of any FTP values $\alpha_0$ through $\alpha_7$ being set to 1. Threshold normalization may be implemented several times through the trellis. Consequently, the value of b may vary and may be equivalent to M. In addition, the transition probability values are not necessarily positive valued; therefore, the MSB may be a sign bit.

Figure 3:
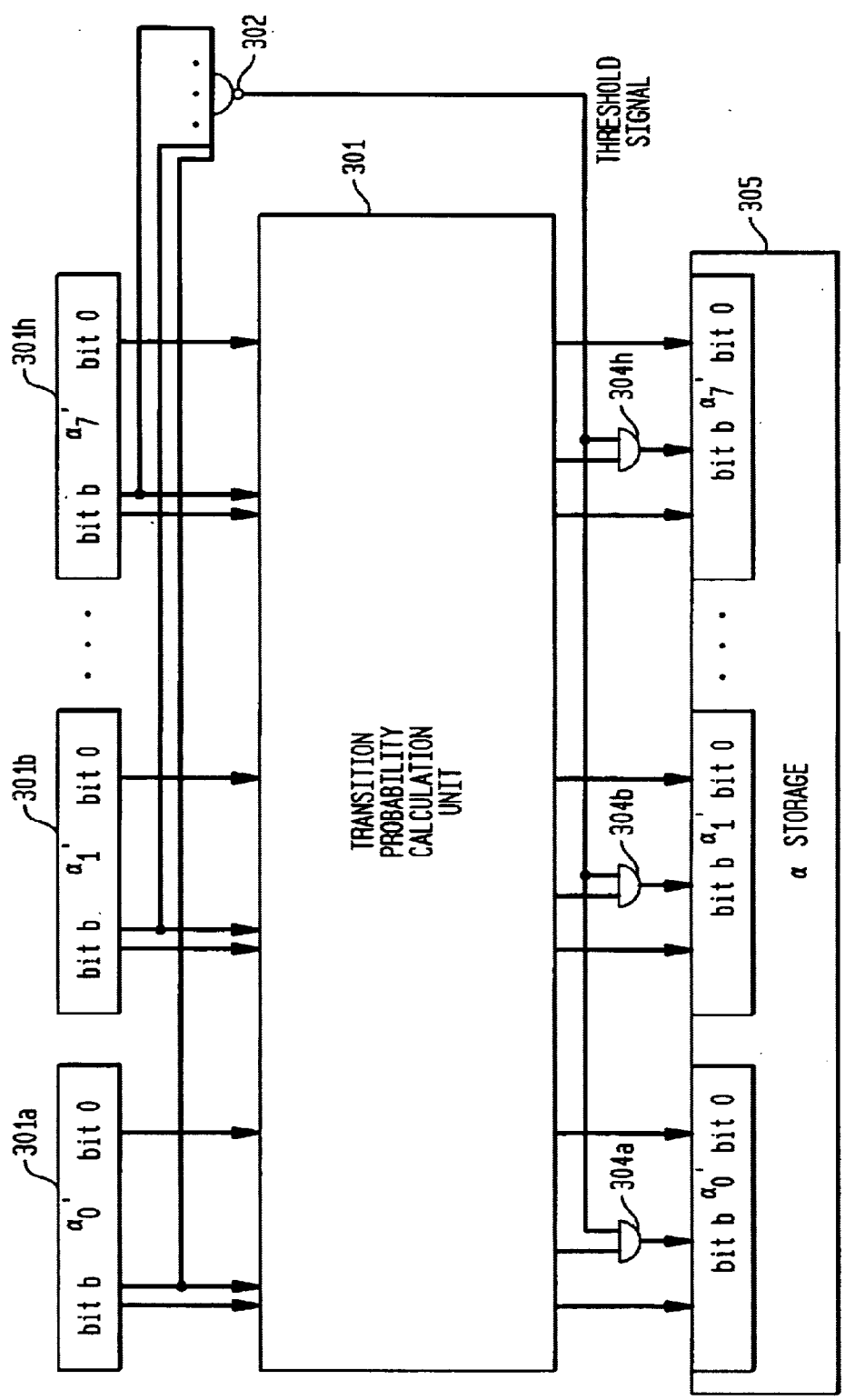
FIG. 3 shows a circuit for threshold normalization detection and scaling in accordance with an alternative exemplary embodiment of the present invention.

For some ML detectors, it may be desirable to calculate transition probabilities in parallel with threshold detection and scaling to reduce delay of signals through the circuit. FIG. 3 shows a circuit for threshold normalization detection and scaling in accordance with an alternative exemplary embodiment of the present invention. For the circuit of FIG. 3, threshold detection occurs prior to calculation of transition probabilities, and scaling occurs after the new transition probabilities are calculated.

Since relative accumulated transition probabilites are employed by the ML detector for path selection, equally scaling all state metrics or transition probabilites at a stage of the trellis does not effect path selection. Consequently, the initial transition probability (for forward transition probabilities) and end transition probability (for reverse transition probabilities) may be scaled or set to predetermined values. The predetermined values allow for two conditions. The first condition is that transition probabilities calculated by the TPC unit (e.g., the TPC unit 201 of FIG. 2) at a current stage of the trellis are greater than the transition probabilities calculated at the previous stage of the trellis. The second condition is that the magnitude of the update of a transition probability calculated by the TPC unit for the current stage of the trellis does not exceed $2^b$.

Given these two conditions, by appropriate selection of initial and/or end transition probabilities, the circuit of FIG. 3 operates as follows. Each of the FTP values $\alpha_0$ through $\alpha_7$ of the previous stage of the trellis is stored in a corresponding one of registers 301a–301h. Threshold detection of the FTP values $\alpha_0$ through $\alpha_7$ stored in corresponding registers 301a–301h is accomplished by the NAND gate 302. The $b^{th}$ bit of each of the FTP values $\alpha_0$ through $\alpha_7$ is applied to the input of NAND gate 302. Unless all input logic values to NAND gate 302 are logic "1", the output of NAND gate 202 is logic "1". When the $b^{th}$ bit of each of the FTP values $\alpha_0$ through $\alpha_7$ is logic "1", all input logic values to NAND gate 302 are logic "1" and the output of NAND gate 302 is logic "0", indicating that all FTP values $\alpha_0$ through $\alpha_7$ have exceeded the threshold value.

Each of the FTP values $\alpha_0$ through $\alpha_7$ in registers 301a–301h is also applied to TPC unit 301. TPC unit 301 calculates new FTP values $\alpha_0'$ through $\alpha_7'$ for the current stage of the trellis. Scaling of new FTP values $\alpha_0'$ through $\alpha_7'$ is then accomplished in a similar manner to that described for the circuit of FIG. 2 using AND gates 304a–304h. AND gates 304a–304h each receive the $b^{th}$ bit of the corresponding one of new FTP values $\alpha_0'$ through $\alpha_7'$ as well as the output of NAND gate 302. When the output of NAND gate 302 is logic "1", the output of AND gates 304a–304h is the $b^{th}$ bit of the corresponding one of new FTP values $\alpha_0'$ through $\alpha_7'$. When the output of NAND gate 302 is logic "0", the output of each AND gate 304a–304h is logic "0", thereby setting the $b^{th}$ bit of the corresponding one of the new FTP values $\alpha_0'$ through $\alpha_7'$ to "0". The scaled, new FTP values $\alpha_0'$ through $\alpha_7'$ are then stored in forward transition probability storage registers 305.

Figure 4:
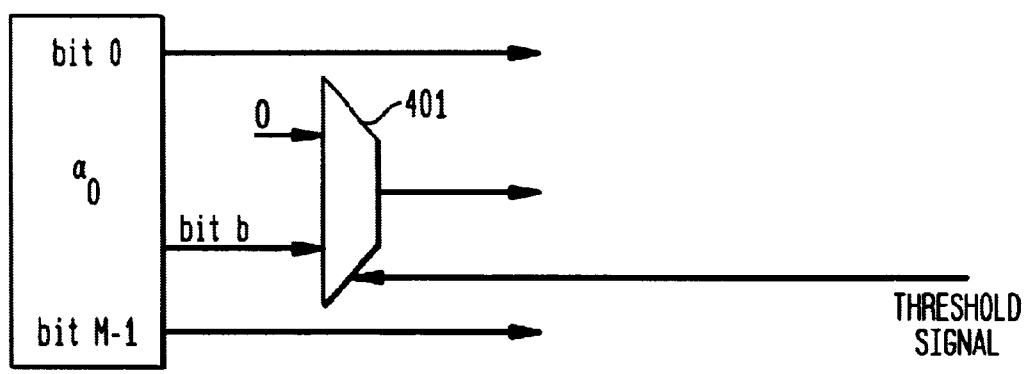
FIG. 4 shows a multiplexer circuit for setting the $b^{th}$ bit based on a threshold signal for the circuits of FIGS. 2 and 3.

As would be apparent to one skilled in the art, the operations of AND gates 203a–203h (FIG. 2) or AND gates 301a–301h (FIG. 3) may be similarly implemented using multiplexers (MUXs) selecting the $b^{th}$ bit or a "0" depending on the signal from NAND gate 202. FIG. 4 illustrates such similar implementation using a mux 401 selecting the $b^{th}$ bit or zero based on a threshold signal, such as the logic output signal of NAND gates 202 or 302.

Implementations of ML detectors including threshold normalization in accordance with exemplary embodiments of the present invention may provide the following advantages. Since magnitude comparison and N-bit subtraction circuits for prior art threshold normalization are relatively complex circuits, prior art circuits may introduce considerable delay and require a relatively large area in an integrated circuit. The circuits of the exemplary implementations of FIGS. 2 and 3 are relatively simple and, therefore, require less area within an integrated circuit than prior art circuits. In addition, since the exemplary implementations of FIGS. 2 and 3 include only a pair of simple logic gates, threshold normalization in accordance with embodiments of the present invention may introduce less circuit delay than prior art circuits.

While the exemplary embodiments of the present invention have been described with respect to processes of circuits, the present invention is not so limited. As would be apparent to one skilled in the art, various functions of circuit elements may also be implemented as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. For a signal processing application, a method of threshold normalization of a plurality of transition probabilities of a state transition trellis, each transition probability stored as a binary value of M bits, comprising the steps of:
   (a) determining if a $b^{th}$ bit of each of the plurality of transition probabilities is set, wherein, if each of the $b^{th}$ bits is set, the plurality of transition probabilities has met a threshold value less than M and related to $2^b$; and
   (b) scaling each of the plurality of transition probabilities if each of the $b^{th}$ bits is set.

2. The method as recited in claim 1, wherein step (b) comprises the step of resetting each $b^{th}$ bit to scale the plurality of transition probabilities.

3. The method as recited in claim 2, wherein, for step (b), resetting each $b^{th}$ bit subtracts the threshold value from each of the plurality of transition probabilities.

4. The method as recited in claim 1, further comprising a step (c) of updating the plurality of transition probabilities.

5. The method as recited in claim 4, wherein, for step (c), the plurality of transition probabilities are scaled before the plurality of transition probabilities are updated.

6. The method as recited in claim 4, wherein, for step (c), the plurality of transition probabilities are scaled after the plurality of transition probabilities are updated.

7. The method as recited in claim 1, further comprising a step (d) of adjusting the value of b based on the source and destination states of the state transition trellis.

8. The method as recited in claim 1, wherein the method is implemented for path selection by a maximum likelihood detection algorithm of a communications receiver in either a transmission or recording system.

9. The method as recited in claim 1, wherein the method is implemented as steps of a processor in an integrated circuit.

10. For a signal processing application, a circuit for threshold normalization of a plurality of transition probabilities of a state transition trellis, each transition probability stored as a binary value of $2^M$ bits, comprising:
    a first logic circuit configured to generate a threshold signal if a $b^{th}$ bit of each of the plurality of transition probabilities is set, wherein, if each of the $b^{th}$ bits is set, the plurality of transition probabilities has met a threshold value less than $2^M$ and related to $2^b$; and
    a second logic circuit configured to scale each of the plurality of transition probabilities based on the threshold signal if each of the $b^{th}$ bits is set.

11. The circuit as recited in claim 10, wherein the first logic circuit comprises a first logic gate, the first logic gate receiving each of the $b^{th}$ bits and generating a logic value as the threshold signal when each of the $b^{th}$ bits is set.

12. The circuit as recited in claim 11, wherein the first logic gate is a NAND gate.

13. The circuit as recited in claim 10, further comprising a transition probability calculation (TPC) unit, wherein the TPC unit updates each of the plurality of transition probabilities.

14. The circuit as recited in claim 13, wherein the TPC unit updates each of the plurality of transition probabilities before the transition probabilities are scaled by the second logic circuit.

15. The circuit as recited in claim 13, wherein the TPC unit updates each of the plurality of transition probabilities after the transition probabilities are scaled by the second logic circuit.

16. The circuit as recited in claim 10, wherein the second logic circuit comprises a plurality of second logic gates, each $b^{th}$ bit of the plurality of transition probabilities provided to a corresponding one of the plurality of second logic gates wherein each second logic gate resets the corresponding $b^{th}$ bit based on the threshold signal from the first logic circuit.

17. The circuit as recited in claim 16, wherein resetting each $b^{th}$ bit subtracts the threshold value from each of the plurality of transition probabilities.

18. The circuit as recited in claim 16, wherein each of the plurality of second logic gates is either an AND gate or a multiplexer.

19. The circuit as recited in claim 10, wherein the value of b is adjusted based on the source and destination states of the state transition trellis.

20. The circuit as recited in claim 10, the circuit is included in a maximum-likelihood detection algorithm of a communications receiver in either a transmission or recording system.

21. The circuit as recited in claim 10, wherein the circuit is embodied in an integrated circuit.

22. The circuit as recited in claim 10, wherein:
    the first logic circuit comprises a NAND gate, the NAND gate receiving each of the $b^{th}$ bits and generating a logic value as the threshold signal when each of the $b^{th}$ bits is set; and
    the second logic circuit comprises a plurality of second logic gates and each $b^{th}$ bit of the plurality of transition probabilities is provided to a corresponding one of the plurality of second logic gates, wherein each second logic gate resets the corresponding $b^{th}$ bit based on the threshold signal from the first logic circuit, and each of the plurality of second logic gates is either an AND gate or a multiplexer.

23. A computer-readable medium having stored thereon a plurality of instructions, the plurality of instructions including instructions which, when executed by a processor, cause the processor to implement a method of threshold normalization of a plurality of transition probabilities of a state transition trellis, each transition probability stored as a binary value of M bits, the method comprising the steps of:
    (a) determining if a $b^{th}$ bit of each of the plurality of transition probabilities is set, wherein, if each of the $b^{th}$ bits is set, the plurality of transition probabilities has met a threshold value less than M and related to $2^b$; and
    (b) scaling each of the plurality of transition probabilities if each of the $b^{th}$ bits is set.

24. The method as recited in claim 23, wherein step (b) comprises the step of resetting each $b^{th}$ bit to scale the plurality of transition probabilities.

25. The method as recited in claim 24, wherein, for step (b), resetting each $b^{th}$ bit subtracts the threshold value from each of the plurality of transition probabilities.

* * * * *